(12) United States Patent
Yamaguchi et al.

(10) Patent No.: US 6,734,040 B2
(45) Date of Patent: May 11, 2004

(54) METHOD OF MANUFACTURING SEMICONDUCTOR DEVICES

(75) Inventors: Yasuo Yamaguchi, Tokyo (JP); Kunihiro Nakamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 157 days.

(21) Appl. No.: 10/173,151

(22) Filed: Jun. 18, 2002

(65) Prior Publication Data

US 2003/0113982 A1 Jun. 19, 2003

(30) Foreign Application Priority Data

Dec. 18, 2001 (JP) ........................................ 2001-384261

(51) Int. Cl.⁷ .............................................. H01L 21/44
(52) U.S. Cl. ........................ 438/107; 438/455; 438/459
(58) Field of Search ........................... 438/107, 455–459

(56) References Cited

U.S. PATENT DOCUMENTS 6,035,714 A * 3/2000 Yazdi et al. .............. 73/514.32

* cited by examiner

Primary Examiner—H. Jey Tsai
(74) Attorney, Agent, or Firm—Oblon, Spivak, McClelland, Maier & Neustadt, P.C.

(57) ABSTRACT

In manufacturing hermetically sealed semiconductor devices, a plurality of generally rectangular openings are first formed into a matrix pattern in a cap silicon wafer so that the plurality of generally rectangular openings are separated by a plurality of row segments extending in a first direction and a plurality of column segments extending in a second direction perpendicular to the first direction. On the other hand, a plurality of semiconductor elements each having a plurality of electrode portions are bonded to a semiconductor wafer. After each of the plurality of generally rectangular openings has been aligned with the plurality of electrode portions of at least one of the plurality of semiconductor elements, the cap wafer is bonded to the plurality of semiconductor elements.

4 Claims, 5 Drawing Sheets

METHOD OF MANUFACTURING SEMICONDUCTOR DEVICES

BACKGROUND OF THE INVENTION

1. Field of the Invention

The present invention relates generally to a method of manufacturing semiconductor devices and, in particular but not exclusively, to a method of manufacturing hermetically sealed semiconductor devices for use as capacitive acceleration sensors or the like having a cap that covers a sensor element formed on a surface of a semiconductor substrate with a gap defined therebetween.

2. Description of the Related Art

In a surface type capacitive acceleration sensor, a sensor element placed on an acceleration sensor wafer segment is covered with a cap wafer segment. In manufacturing such acceleration sensors, a cap wafer is bonded to a plurality of sensor elements before it is cut into a plurality of cap wafer segments.

FIGS. 8 to 11 schematically depict a conventional capacitive acceleration sensor. FIGS. 8 and 9 depict an acceleration sensor wafer 1 and a plurality of acceleration sensor elements 3, respectively. The acceleration sensor wafer 1 has an area 2 indicated by hatching, on which a number of acceleration sensor elements 3 are placed and bonded. FIG. 9 particularly depicts nine acceleration sensor elements 3 juxtaposed with one another and each having a plurality of (for example, five) electrode portions 4 disposed in a line for taking out electric signals.

FIG. 10 depicts a cap wafer 5 that is to be bonded to the acceleration sensor wafer 3 and has a number of elongated openings 6 defined therein and extending in the same direction with a silicon strip 7 interposed between neighboring elongated openings 6. During the manufacture of the acceleration sensors, the cap wafer 5 is processed separately from the acceleration sensor wafer 1, and is then placed on and bonded to the acceleration sensor elements 3.

As shown in FIG. 11, when the cap wafer 5 is placed on the acceleration sensor elements 3, the electrode portions 4 need respective gaps for the purpose of taking out electric signals, and the elongated openings 6 are used for such gaps. Furthermore, because the number of acceleration sensor elements 3 are arranged orderly, the electrode portions 4 form a plurality of rows spaced at regular intervals. For this reason, the elongated openings 6 formed in the cap wafer 5 extend in the same direction at the same intervals as those of the rows of electrode portions 4.

Accordingly, the relatively narrow elongated openings 6 and the relatively narrow silicon strips 7 are formed alternately in the cap wafer 5 and, hence, a problem arose that the cap wafer 5 is susceptible to cracking during the manufacture thereof. Also, because the bonding is carried out at a high temperature (about 450° C.), the silicon strips 7 are apt to become deformed by heating during the bonding, resulting in insufficient bonding.

SUMMARY OF THE INVENTION

The present invention has been developed to overcome the above-described disadvantages.

It is accordingly an objective of the present invention to provide a method of manufacturing semiconductor devices capable of enhancing the characteristic accuracy by enhancing the reliability and strength during the bonding.

Another objective of the present invention is to provide a method of manufacturing semiconductor devices capable of reducing the size and cost thereof.

In accomplishing the above and other objectives, the method according to the present invention is characterized by forming a plurality of generally rectangular openings into a matrix pattern in a cap silicon wafer so that the plurality of generally rectangular openings are separated by a plurality of row segments extending in a first direction and a plurality of column segments extending in a second direction perpendicular to the first direction. On the other hand, a plurality of semiconductor elements each having a plurality of electrode portions are bonded to a semiconductor wafer. Furthermore, after each of the plurality of generally rectangular openings has been aligned with the plurality of electrode portions of at least one of the plurality of semiconductor elements, the cap wafer is bonded to the plurality of semiconductor elements.

Because the row segments are reinforced by the column segments, cracking of the cap wafer is avoided that has been hitherto caused by conveying or handling it during the manufacture thereof. Also, during bonding, the cap wafer is free from any deformation which has been hitherto caused by heating and, in particular, the bonding can be carried out without being affected by, for example, a horizontal torsion that has a serious effect on the relatively narrow silicon strips of the conventional cap wafer. Accordingly, the reliability and strength during the bonding are enhanced, resulting in a semiconductor device having high characteristic accuracy.

It is preferred that after the cap wafer has been bonded to the plurality of semiconductor elements, the plurality of column segments be removed by grinding the cap wafer. By so doing, all the semiconductor elements mounted on the entire semiconductor wafer can be used, making it possible to increase the yield.

Advantageously, the plurality of column segments are aligned with a plurality of dicing lines, and dicing is carried out along the plurality of column segments, resulting in a reduction in size and cost of chips.

In another aspect of the present invention, the method of manufacturing hermetically sealed semiconductor devices is characterized by bonding a plurality of semiconductor elements each having a plurality of electrode portions to a semiconductor wafer, forming a plurality of recesses in a cap wafer, bonding the cap wafer to the plurality of semiconductor elements so that the plurality of electrode portions of each of the plurality of semiconductor elements are accommodated in one of the plurality of recesses, and grinding the cap wafer to remove those portions of the cap wafer that are aligned with the plurality of electrode portions of each of the plurality of semiconductor elements.

This method facilitates the processing of the cap wafer, and because no openings are formed in the cap wafer before the bonding, the cap wafer has an increased strength. Accordingly, the reliability and strength during the bonding are enhanced, resulting in a semiconductor device having high characteristic accuracy.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

This application is based on an application No. 2001-384261 filed Dec. 18, 2001 in Japan, the content of which is herein expressly incorporated by reference in its entirety.

Embodiment 1

Figure 1:
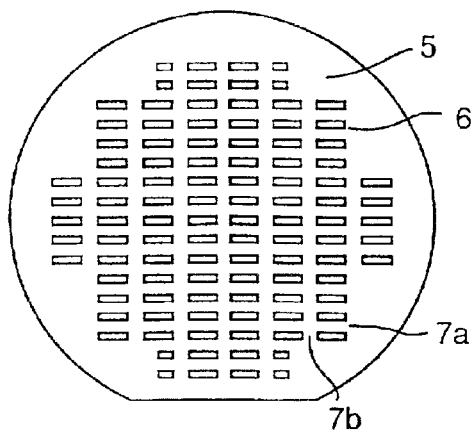
FIG. 1 is a top plan view of a cap wafer attached to capacitive acceleration sensors according to the first embodiment of the present invention.

Referring now to the drawings, there is shown in FIG. 1 a cap silicon wafer 5 that is to be attached to capacitive acceleration sensors according to the present invention. The cap wafer 5 has a number of generally rectangular openings 6 defined therein so as to be aligned in a first direction (horizontal direction in FIG. 1) at regular intervals and in a second direction (vertical direction in FIG. 1) perpendicular to the first direction at regular intervals. In short, the number of generally rectangular openings are generally formed into a matrix pattern. Accordingly, the number of generally rectangular openings 6 are separated by a plurality of row segments 7a extending in the first direction at regular intervals and by a plurality of column segments 7b extending in the second direction at regular intervals to reinforce the row segments 7a.

According to a first embodiment of the present invention, the width of the generally rectangular openings 6 in the cap wafer 5 is considerably greater than that shown in FIG. 1. More specifically, the generally rectangular openings 6 in the cap wafer 5 are formed so as to have a width that is several times or several tens of times greater than that of each acceleration sensor.

As is the case with the conventional surface type capacitive acceleration sensor referred to above, a number of acceleration sensor elements 3 are bonded to a specific area 2 on an acceleration sensor wafer 1, and during the manufacture of the acceleration sensors, the cap wafer 5 is processed separately from the acceleration sensor wafer 1, and is then placed on and bonded to the acceleration sensor elements 3.

Figure 10:
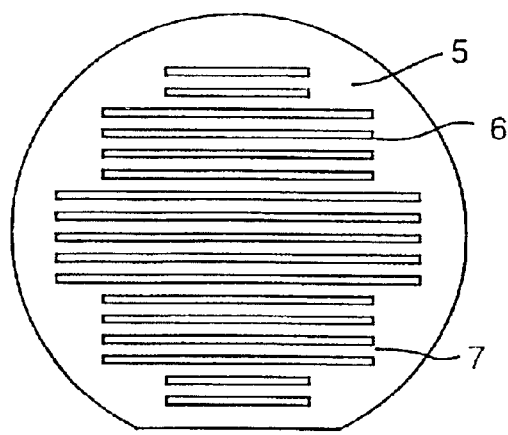
FIG. 10 is a top plan view of a cap wafer bonded to the sensor elements of FIG. 9.
Figure 11:
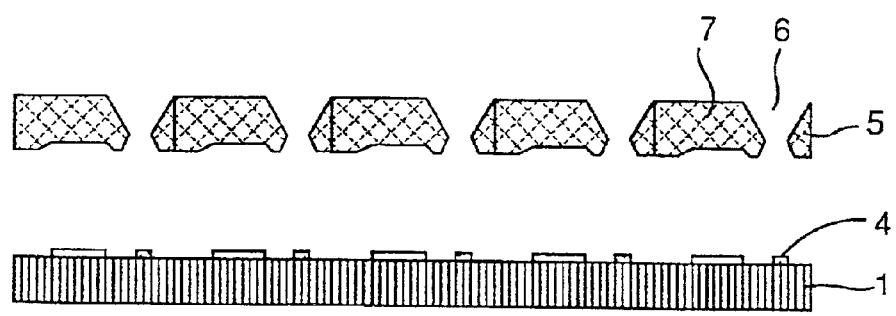
FIG. 11 is a vertical sectional view of the sensor wafer of FIG. 8 with the cap wafer of FIG. 10 positioned above it.

The cap wafer 5 of FIG. 1 does not have the relatively narrow silicon strips 7 as provided in the conventional cap wafer of FIG. 10, but has the reinforcing column segments 7b that provide the cap wafer 5 with sufficient strength, making it possible to avoid cracking during the manufacture of the cap wafer 5. Also, during bonding, the cap wafer 5 is free from any deformation which has been hitherto caused by heating and, in particular, the bonding can be carried out without being affected by, for example, a horizontal torsion that has a serious effect on the relatively narrow silicon strips 7 of the conventional cap wafer.

Embodiment 2

In the first embodiment referred to above, because the acceleration sensor elements 3 are arranged orderly on the specific area 2 of the acceleration sensor wafer 1, those of the acceleration sensor elements 3 that are located immediately below the reinforcing column segments 7b cannot be used.

This embodiment is intended to eliminate such unserviceable acceleration sensor elements 3 and make it possible to use all the acceleration sensor elements 3.

FIGS. 2A to 2H (or 2H') depict a flow indicating the manufacture of the cap wafer 5 and the process until it is bonded to the acceleration sensor wafer 1. The manufacture of the acceleration sensor wafer 1 is omitted from these figures.

Figure 2A:
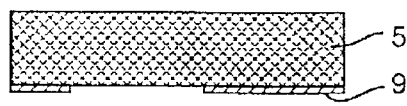
FIGS. 2A to 2H (or 2H') are schematic sectional views depicting the manufacturing process of the capacitive acceleration sensors according to the second embodiment of the present invention, FIG. 2A depicting the step of processing a silicon oxide or nitride film into a desired shape, FIG. 2B depicting the step of etching the cap wafer, FIG. 2C depicting the step of further processing the silicon oxide or nitride film into a desired shape, FIG. 2D depicting the step of further etching the cap wafer, FIG. 2E depicting the step of forming an etching mask and a photoresist on opposite surfaces of the cap wafer, respectively, FIG. 2F depicting the step of further etching the cap wafer and being a sectional view taken along the line A—A in FIG. 3, FIG. 2F' being a sectional view taken along the line B—B in FIG. 3, FIGS. 2G and 2G' depicting the step of bonding the cap wafer to an acceleration sensor wafer and being sectional views taken along the lines A—A and B—B in FIG. 3, respectively, and FIGS. 2H and 2H' depicting the step of grinding the cap wafer and being sectional views taken along the lines A—A and B—B in FIG. 3, respectively.
Figure 2B:
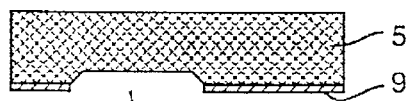

A silicon oxide film or a silicon nitride film is first formed on a surface (lower surface in FIG. 2A) of the cap wafer 5, and a photoresist (not shown) is then formed, by photolithography, on the silicon oxide film or silicon nitride film at portions that are not to be aligned with movable portions 8 (see FIG. 2G) of the acceleration sensor elements 3. As shown in FIG. 2A, the silicon oxide film or silicon nitride film is subsequently processed into a desired shape 9 using the photoresist. Thereafter, as shown in FIG. 2B, the cap wafer 5 is etched with the silicon oxide film or silicon nitride film used as an etching mask 9 so that first recesses 10 may be formed into a depth of about 2–100 μm in the cap wafer 5.

Figure 2C:
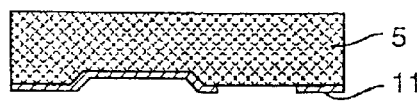
Figure 2D:
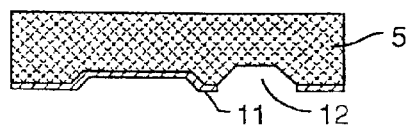

As shown in FIG. 2C, a photoresist (not shown) is formed, by photolithography, on the silicon oxide film or silicon nitride film at portions that are not to be aligned with electrode portions 4 (see FIG. 2G) of the acceleration sensor elements 3, and the silicon oxide film or silicon nitride film is then processed into a desired shape using the photoresist. Thereafter, as shown in FIG. 2D, the cap wafer 5 is etched with the silicon oxide film or silicon nitride film used as an etching mask 11 so that second recesses 12 may be formed into a depth of about 10–200 μm greater than the depth of the first recesses 10 in the cap wafer 5.

Figure 2E:
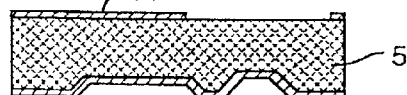

As shown in FIG. 2E, an etching mask 13 of an oxide or nitride film is formed on the surface of the cap wafer 5, and a photoresist (not shown) is formed, by photolithography, on a silicon oxide film or silicon nitride film on another surface of the cap wafer 5 at portions that are not to be aligned with the electrode portions 4 of the acceleration sensor elements 3, though a portion that is to be positioned immediately above a specific one of the electrode portions 4 of each of the acceleration sensor elements 3 is covered with the photoresist. The silicon oxide film or silicon nitride film is then processed into a desired shape using the photoresist. Furthermore, as shown in FIG. 2F, with the use of the silicon oxide film or silicon nitride film as an etching mask 14, etching is performed with respect to the cap wafer 5 to form third recesses until each of the third recesses communicates with an associated one of the second recesses 12, thus forming the generally rectangular openings 6.

Figure 3:
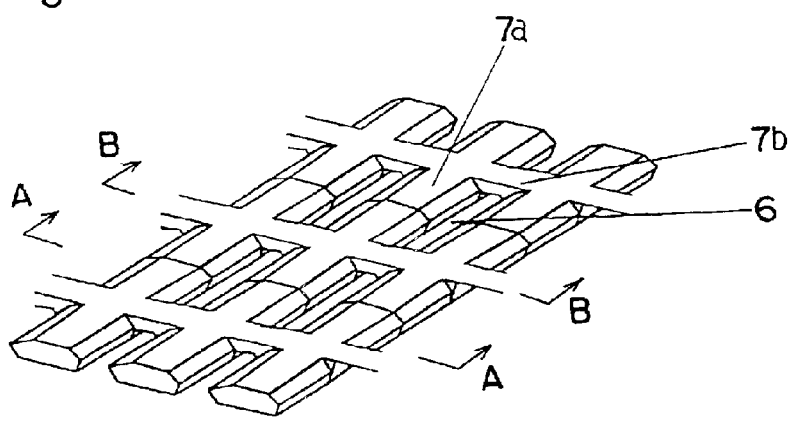
FIG. 3 is a perspective view of a portion of the cap wafer obtained by the process shown in FIGS. 2A to 2H (or 2H')
Figure 2F:
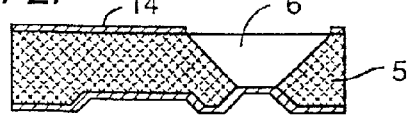
Figure 2F:
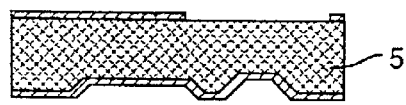

It is to be noted here that FIG. 2F is a sectional view taken along the line A—A in FIG. 3, while FIG. 2F' is a sectional view taken along the line B—B in FIG. 3. As shown in FIG. 2F', selected portions of the cap wafer 5 are kept intact without being etched and used as the column segments 7b to reinforce the row segments 7a.

Figure 2G:
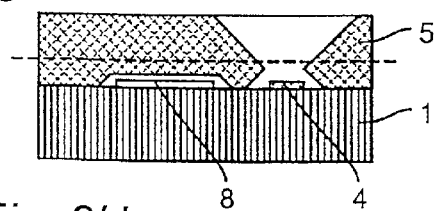
Figure 2G:
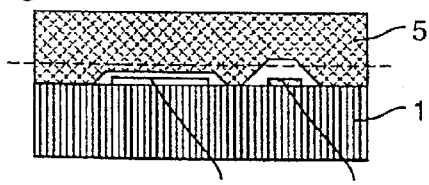
Figure 2H:
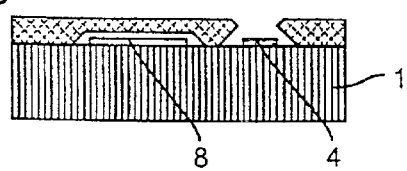
Figure 2H:
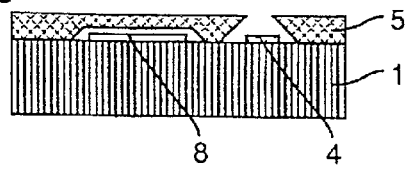

Thereafter, all the etching masks are removed and, as shown in FIGS. 2G and 2G', after the acceleration sensor wafer 1 and the cap wafer 5 have been bonded together, the cap wafer 5 is ground to a level indicated by a dotted line to have a reduced thickness so that the electrode portions 4 accommodated in the second recesses 12 may be exposed as shown in FIGS. 2H and 2H'.

Figure 4:
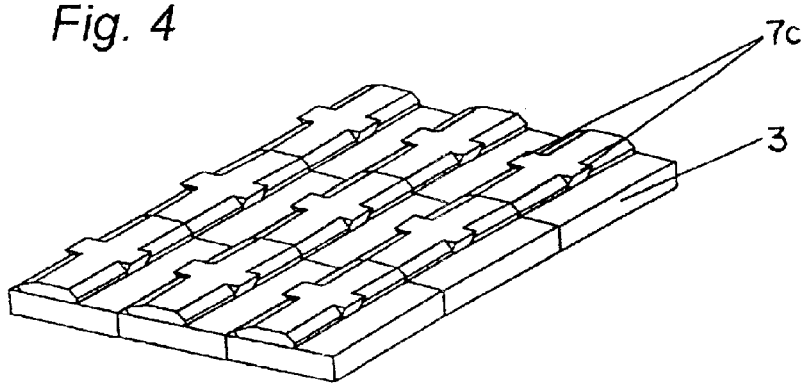
FIG. 4 is a perspective view of some of the acceleration sensors after the cap wafer has been ground.
Figure 5:
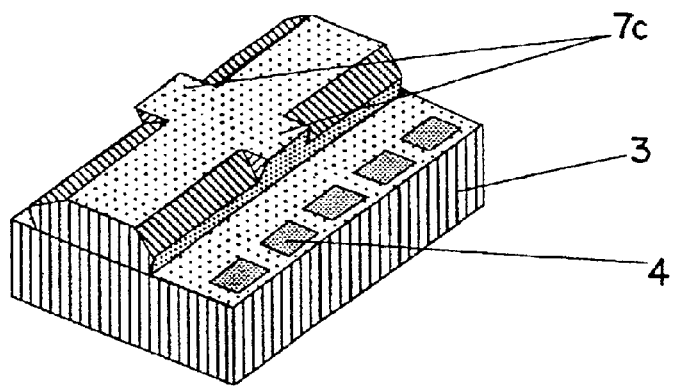
FIG. 5 is a perspective view, on an enlarged scale, of one of the accelerations sensors of FIG. 4.

FIG. 4 depicts a plurality of acceleration sensors after the grinding, and FIG. 5 depicts one of them on an enlarged scale. In these figures, reference numeral 7c denotes remnants of the column segments 7b after the grinding. FIGS. 3 to 5 and FIGS. 6 and 7 explained later depict the case where the generally rectangular openings 6 in the cap wafer 5 are formed so as to have a width that is substantially equal to that of each acceleration sensor.

In the first embodiment, the acceleration sensor elements 3 positioned immediately below the reinforcing column segments 7b are unserviceable, whereas in this embodiment all the acceleration sensor elements 3 can be used because after the acceleration sensor wafer 1 and the cap wafer 5 have been bonded together, the reinforcing column segments 7b are removed by grinding the cap wafer 5 to a predetermined thickness.

Embodiment 3

In the second embodiment referred to above, the remnants 7c of the column segments 7b appear due to the characteristics of etching and are positioned above the electrode portions 4 of the acceleration sensor elements 3. Accordingly, there is a good chance that an interference may occur at the time of wire-bonding during assemblage. To avoid the interference, it is necessary to increase the distance between the remnants 7c of the column segments 7b and the associated electrode portions 4 of the acceleration sensor elements 3, resulting in an increase in chip size.

Figure 6:
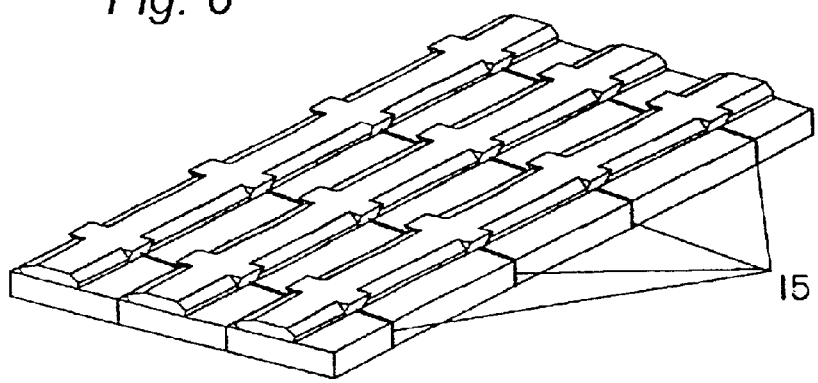
FIG. 6 is a view similar to FIG. 3, but according to the third embodiment of the present invention.

This embodiment is intended to solve such problem. As shown in FIG. 6, during dicing in which the two wafers 1, 5 bonded together are cut into a number of chips, the reinforcing column segments 7b are aligned with dicing lines 15 so that the dicing may be carried out along the column segments 7b to remove the remnants 7c of the column segments 7b.

In this case, the column segments 7b aligned with the dicing lines 15 are arranged so as not to be in line with any electrodes of each acceleration sensor element 3 but to pass between two neighboring electrodes.

Embodiment 4

In this embodiment, the cap wafer 5 is processed so that no generally rectangular openings may be formed over the whole area of the cap wafer 5. That is, the cap wafer 5 is processed so as to have a sectional shape as shown in FIG. 2E over the whole area of the cap wafer 5.

Figure 7:
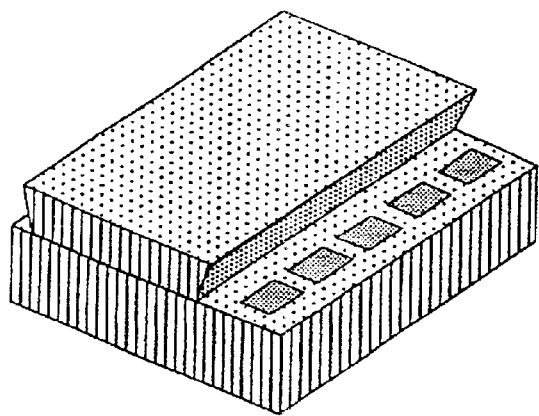
FIG. 7 is a view similar to FIG. 5, but according to the fourth embodiment of the present invention.
Figure 8:
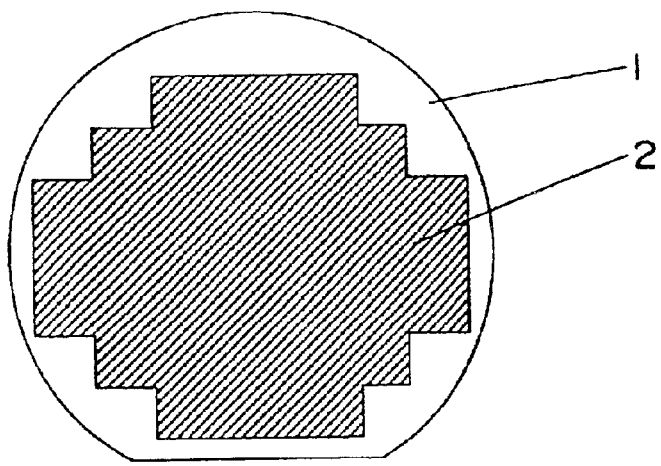
FIG. 8 is a top plan view of a sensor wafer for use in manufacturing conventional capacitive acceleration sensors.
Figure 9:
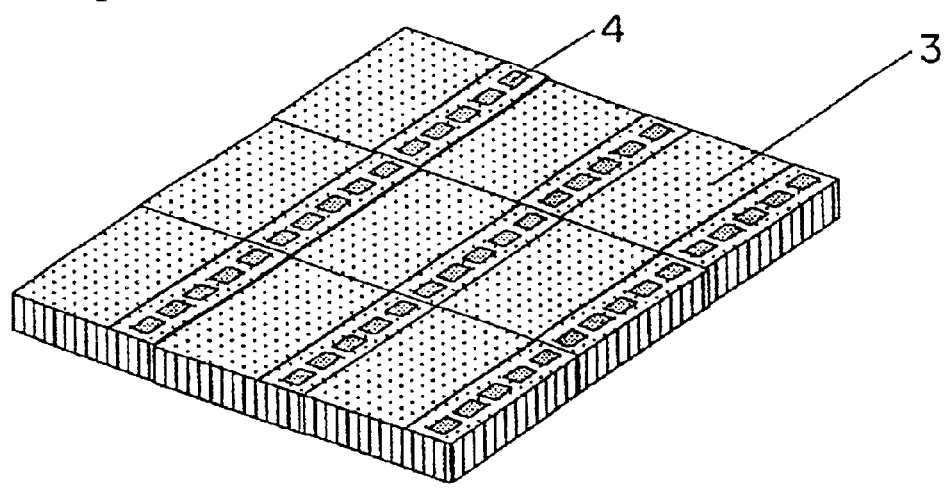
FIG. 9 is a perspective view of sensor elements bonded to the sensor wafer of FIG. 8.

FIG. 7 is a perspective view of one of the chips after the acceleration sensor elements 3 and the cap wafer 5 have been bonded together. Of the process shown in FIGS. 2A to 2H (or 2H'), the etching process shown in FIG. 2F is omitted. Because no generally rectangular openings are formed in processing the cap wafer 5, the cap wafer 5 according to this embodiment has a strength greater than that of the cap wafer according to the first, second or third embodiment referred to above.

Embodiment 5

In this embodiment, the generally rectangular openings 6 in the cap wafer 5 are processed by wet etching. Because silicon has a crystal orientation as shown in FIGS. 2A to 2H (or 2H'), the wet etching causes the generally rectangular openings 6 to have tapered side walls.

Embodiment 6

In this embodiment, the generally rectangular openings 6 in the cap wafer 5 are processed by dry etching.

Unlike the wet etching the dry etching is carried out independently of the crystal orientation of silicon and, hence, does not create a shape peculiar to such crystal orientation, which is created by the wet etching. Accordingly, the generally rectangular openings 6 come to have generally vertical side walls. For this reason, the cap wafer 5 is processed so as to have a shape corresponding to the shape of a mask pattern, making it possible to facilitate the chip design. Furthermore, it is not necessary to take into account a surplus of the shape caused by the angle of inclination, making it possible to reduce the chip size.

Although several embodiments have been described above taking the case of the capacitive acceleration sensor, the present invention is not limited thereto but is applicable to semiconductor devices having a movable portion in a semiconductor element such, for example, as actuators, physical sensors such as pressure sensors for detecting the physical quantity, and the like.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A method of manufacturing hermetically sealed semiconductor devices, comprising:

forming a plurality of generally rectangular openings into a matrix pattern in a cap silicon wafer so that the plurality of generally rectangular openings are separated by a plurality of row segments extending in a first direction and a plurality of column segments extending in a second direction perpendicular to the first direction;

bonding a plurality of semiconductor elements each having a plurality of electrode portions to a semiconductor wafer;

aligning each of the plurality of generally rectangular openings with the plurality of electrode portions of at least one of the plurality of semiconductor elements; and bonding the cap silicon wafer to the plurality of semiconductor elements.

2. The method according to claim 1 further comprising, after bonding the cap silicon wafer, grinding the cap silicon wafer to remove the plurality of column segments.

3. The method according to claim 2, wherein the plurality of column segments are aligned with a plurality of dicing lines so that dicing is carried out along the plurality of column segments.

4. A method of manufacturing hermetically sealed semiconductor devices, comprising:

bonding a plurality of semiconductor elements each having a plurality of electrode portions to a semiconductor wafer;

forming a plurality of recesses in a cap wafer;

bonding the cap wafer to the plurality of semiconductor elements so that the plurality of electrode portions of each of the plurality of semiconductor elements are accommodated in one of the plurality of recesses; and grinding the cap wafer to remove those portions of the cap wafer that are aligned with the plurality of electrode portions of each of the plurality of semiconductor elements.

* * * * *